(12) United States Patent
Yi

(10) Patent No.: US 8,748,990 B2
(45) Date of Patent: Jun. 10, 2014

(54) HIGH VOLTAGE SWITCHING DEVICE THE METHOD FOR FORMING THEREOF

(71) Applicant: Chengdu Monolithic Power Systems Co., Ltd., Chengdu (CN)

(72) Inventor: Kun Yi, Chengdu (CN)

(73) Assignee: Chengdu Monolithic Power Systems Co., Ltd., Chengdu (CN)

(*) Notice: Subject to any disclaimer, the term of this patent is extended or adjusted under 35 U.S.C. 154(b) by 0 days.

(21) Appl. No.: 13/843,877

(22) Filed: Mar. 15, 2013

(65) Prior Publication Data

US 2013/0277755 A1    Oct. 24, 2013

(30) Foreign Application Priority Data

Apr. 19, 2012   (CN) .......................... 2012 1 0115827

(51) Int. Cl.
*H01L 21/70* (2006.01)
*H01L 29/78* (2006.01)
*H01L 21/336* (2006.01)
*H01L 21/28* (2006.01)
*H01L 29/47* (2006.01)
*H01L 29/66* (2006.01)

(52) U.S. Cl.
CPC ........... *H01L 29/78* (2013.01); *H01L 29/66477* (2013.01)
USPC ............ 257/368; 257/380; 438/238; 438/197

(58) Field of Classification Search
CPC ................................. H01L 29/00; H05B 41/00
USPC ............................ 257/380, 368; 438/238, 197
See application file for complete search history.

(56) References Cited

U.S. PATENT DOCUMENTS

| | | | | |
|---|---|---|---|---|
| 2004/0113204 | A1* | 6/2004 | Tsuchiko | 257/341 |
| 2004/0140517 | A1* | 7/2004 | Tsuchiko | 257/493 |
| 2006/0113625 | A1* | 6/2006 | Bude et al. | 257/491 |
| 2009/0256212 | A1* | 10/2009 | Denison et al. | 257/408 |
| 2011/0151634 | A1* | 6/2011 | Denison et al. | 438/270 |
| 2012/0228704 | A1* | 9/2012 | Ju | 257/339 |
| 2013/0082335 | A1* | 4/2013 | Zinn | 257/408 |
| 2013/0153956 | A1* | 6/2013 | Shi et al. | 257/140 |
| 2013/0244390 | A1* | 9/2013 | Zinn | 438/286 |

* cited by examiner

*Primary Examiner* — Telly Green

(74) *Attorney, Agent, or Firm* — Perkins Coie LLP

(57) ABSTRACT

A high voltage switching device and associated method of manufacturing, the high voltage switching device having a substrate, an epitaxial layer, a source region, a drain region, a drift region, a gate oxide, a filed oxide, a gate and a snake shaped poly.

14 Claims, 8 Drawing Sheets

HIGH VOLTAGE SWITCHING DEVICE THE METHOD FOR FORMING THEREOF

CROSS-REFERENCE TO RELATED APPLICATION(S)

This application claims priority to and the benefit of Chinese Patent Application No. 201210115827.8, filed Apr. 19, 2012, which is incorporated herein by reference in its entirety.

TECHNICAL FIELD

The present invention relates generally to switching devices, and more particularly but not exclusively to high voltage switching device and the manufacture process thereof.

BACKGROUND

For electronic circuit using switching devices, generally the drain voltage of the switching device is sensed to execute the line under voltage lockout (UVLO) or over voltage protection (OVP). Traditional technology uses a metal run to cross over the drift region to connect the drain pad and the resistor divider together to get the required sensed voltage. But for high voltage switching device applications, the high voltage drop across the metal run will greatly decrease the breakdown voltage of the switching device, and even break the switching device.

Prior art have tried various ways to eliminate the above effect. One approach is to isolate metal's effect on the silicon surface's electrical field distribution by making two poly plate layers, which complicates the process and leads to switching device's low reliability. Another approach uses an extra drain pad outside of the switching device to connect to the resistor divider, and uses bonding wire to connect two drain pads to the lead frame. Such approach needs an extra pad, which increases cost.

SUMMARY

It is an object of the present invention to provide an improved high voltage switching device, which solves above problems.

In accomplishing the above and other objects, there has been provided, in accordance with an embodiment of the present invention, a high voltage switching device, comprising: a substrate of a first doping type; an epitaxial layer formed on the substrate; a source region of the first doping type formed in the epitaxial layer; a drain region of a second doping type formed in the epitaxial layer; a drift region formed between the source region and the drain region; a gate oxide, part of the source region being covered by the gate oxide; a field oxide, wherein the epitaxial layer other than the part covered by the gate oxide is covered by the filed oxide; a gate formed on the gate oxide; and a snake shaped poly formed on the field oxide over the drift region, the snake shaped poly having a first end and a second end, the first end being contacted with the drain region, and the second end being close to the gate but being separated from the gate.

In addition, there has been provided, in accordance with an embodiment of the present invention, a method for forming a high voltage switching device, comprising: forming a substrate of a first doping type; forming an epitaxial layer of the first doping type on the substrate; forming a source region, a drain region and a drift region in the epitaxial layer, the drift region being placed between the source region and the drain region, the source region being of the first doping type, and the drain region being of a second doping type; forming a gate oxide and a field oxide on the epitaxial layer, part of the source region being covered by the gate oxide, and the epitaxial layer other than the part covered by the gate oxide being covered by the field oxide; forming a gate on the gate oxide, and forming a snake shaped poly on the field oxidation over the drift region, the snake shaped poly having a first end and a second end, the first end being contacted with the drain region, while the second end being close to the gate but being separated from the gate.

The use of the similar reference label in different drawings indicates the same of like components.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

It is to be understood in these letters patent that the meaning of "A" is coupled to "B" is that either A and B are connected to each other as described below, or that, although A and B may not be connected to each other as described below, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

Figure 1:
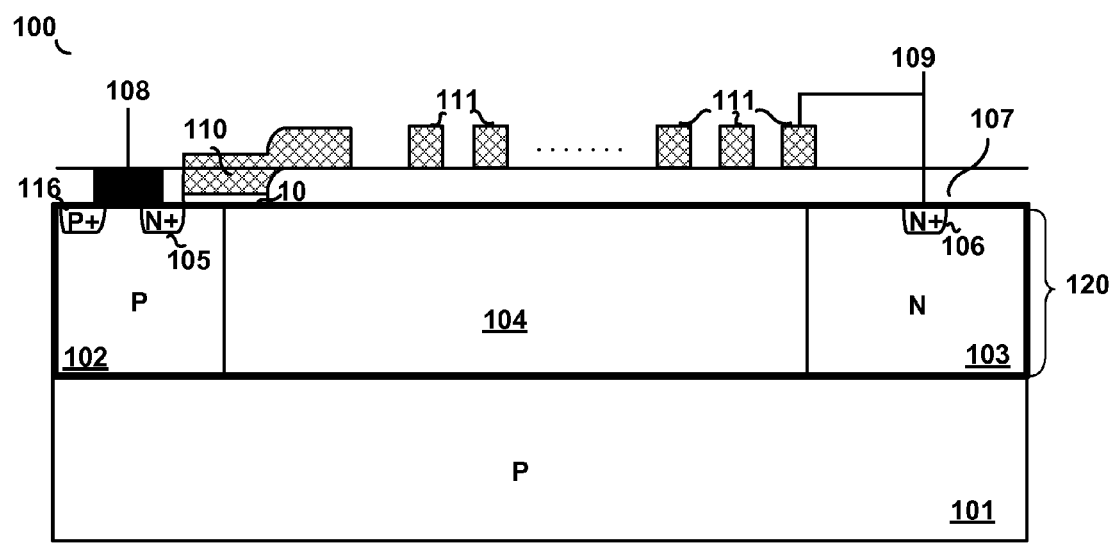
FIG. 1 schematically shows a cross-section view 100 of a high voltage switching device in accordance with an embodiment of the present invention.

FIG. 1 schematically shows a cross-section view 100 of a high voltage switching device in accordance with an embodiment of the present invention. In the example of FIG. 1, the high voltage switching device comprises: a substrate 101 of a first doping type; an epitaxial layer 120 formed on the substrate 101; a source region 102 of the first doping type formed in the epitaxial layer 120; a drain region 103 of a second doping type formed in the epitaxial layer 120; a drift region 104 formed between the source region 102 and the drain region 103; a gate oxide 10, wherein part of the source region 102 is covered by the gate oxide 10; a field oxide 107, wherein the epitaxial layer 120 other than the part covered by the gate oxide 10 is covered by the field oxide 107; a gate 110 formed on the gate oxide 10; and a snake shaped poly 111 formed on the field oxide 107 over the drift region 104, the snake shaped poly 111 having a first end and a second end, wherein the first end is contacted with the drain region 103, and the second end is close to the gate 110 but is separated from the gate 110.

In one embodiment, the high voltage switching device further comprises: a first highly doped region 105 and a second highly doped region 116 formed in the source region 102; and a third highly doped region 106 formed in the drain region 103; wherein the first highly doped region 105 and the third highly doped region 106 are of the second doping type, while the second highly doped region 116 is of the first doping type.

In one embodiment, the high voltage switching device further comprises: a source electrode 108 contacted with the first highly doped region 105 and with the third highly doped region 106; and a drain electrode 109 contacted with the second highly doped region 116.

In one embodiment, the gate 110 comprises a poly gate.

In one embodiment, the high voltage switching device comprises a Metal-Oxide-Semiconductor Field Effect Transistor (MOSFET) or a Junction Field Effect Transistor (JFET). If the high voltage switching device comprises an N type device, the first doping type is P type, and the second doping type is N type; if the high voltage switching device comprises a P type device, the first doping type is N type, and the second doping type is P type.

In the example of FIG. 1, the high voltage switching device comprises an N type MOSFET, the first doping type is P type, and the second doping type is N type.

In one embodiment, the gate oxide 10 and the field oxide 107 both comprise silicon dioxide. But one skilled in the art should realize that the gate oxide and the field gate may comprise other dielectrics.

Figure 2:
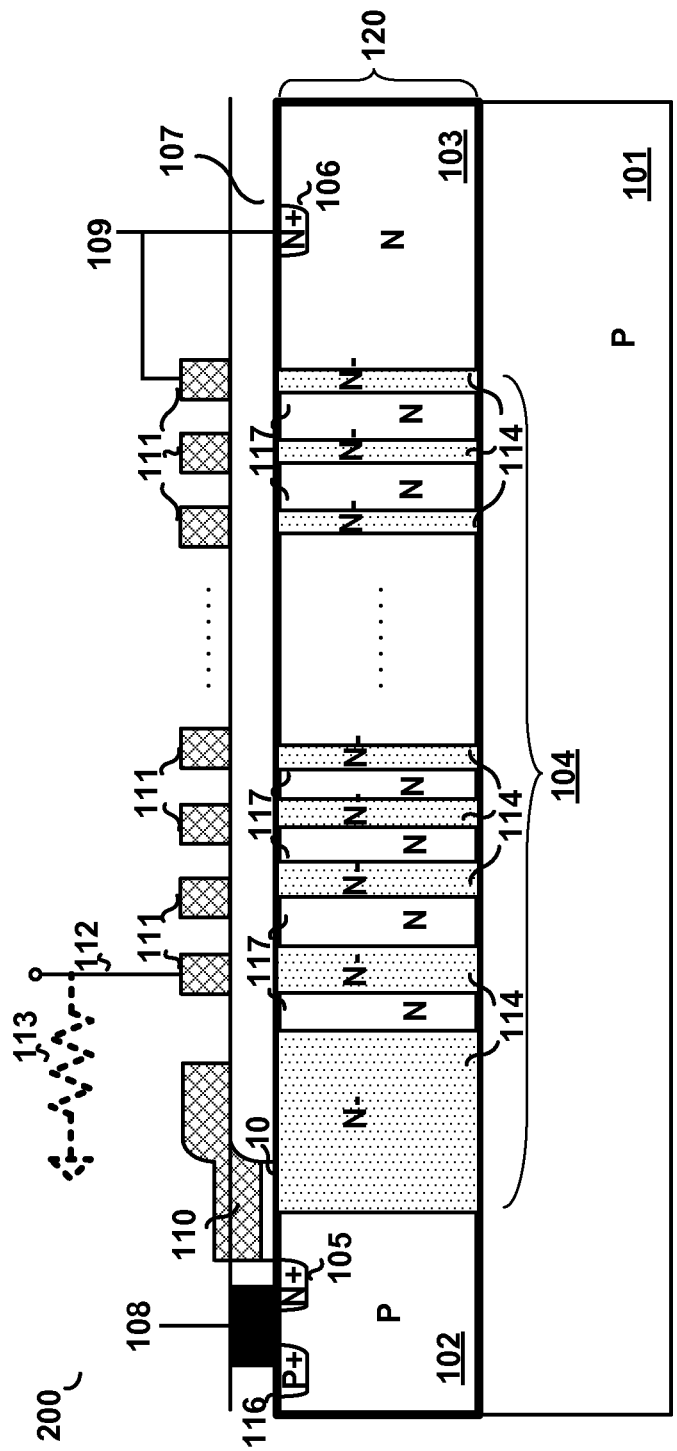
FIG. 2 schematically shows a cross-section view 200 of a high voltage switching device in accordance with an embodiment of the present invention.

FIG. 2 schematically shows a cross-section view 200 of a high voltage switching device in accordance with an embodiment of the present invention. The high voltage switching device in FIG. 2 is similar to that in FIG. 1. Different than the high voltage switching device in FIG. 1, the drift region 104 of the high voltage switching device in FIG. 2 comprises several lightly doped regions 114 (as shown "N-" in FIG. 2) and several third regions 117 of normal doping level, wherein the lightly doped regions 114 and the third regions 117 are alternately in turn placed in the drift region 104. In one embodiment, the third regions 117 have a doping level similar to that of the drain region 103, the highly doped (N+) region (e.g., the first highly doped region 105, the second highly doped region 116 or the third highly doped region 106) has a doping level higher than that of the drain region 103, and the lightly doping regions 114 have a doping level lower than that of the drain region 103. That is, the doping level in the lightly doping regions (e.g., region 114) is lower than that of in the third doping regions (e.g., region 117); and the doping level in the third doping regions (e.g., region 117) is lower than that of in the highly doping region (e.g., region 105, 116 or 106). In one embodiment, the lightly doping regions 114 and the third regions 117 are both of the second doping type.

In one embodiment, the second end of the snake shaped poly 111 is led out by metal wire, and is coupled to a ground reference via a resistor 113 (as shown in the dashed line in FIG. 2). But one skilled in the art should realize that any suitable point along the snake shaped poly 111 may be led out instead of the second end.

Figure 3:
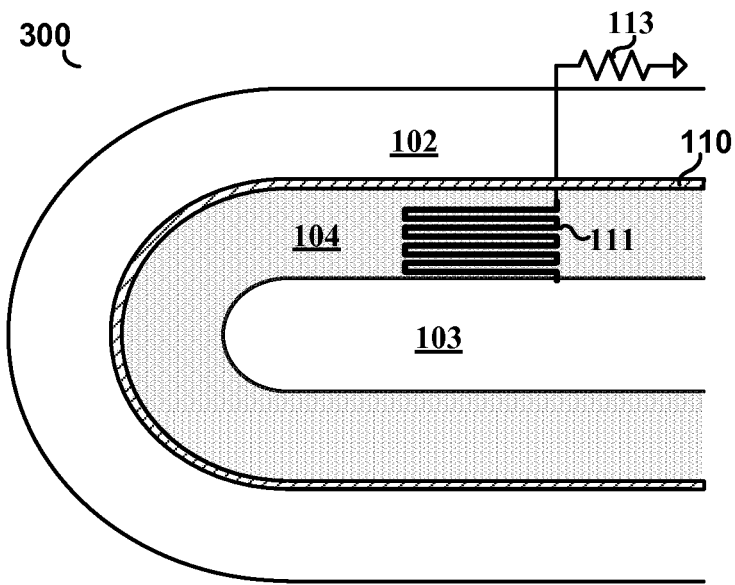
FIG. 3 schematically shows a top view 300 of a high voltage switching device in accordance with an embodiment of the present invention.

FIG. 3 schematically shows a top view 300 of a high voltage switching device in accordance with an embodiment of the present invention. As shown in FIG. 3, the snake shaped poly 111 is spiraled over the drift region 104, which increases the resistance of the snake shaped poly 111 by lengthening the poly.

In one embodiment, the resistance of the snake shaped poly 111 is in the range of $3\times10^6\Omega\sim5\times10^6\Omega$, e.g., the snake shaped poly 111 may have a resistance of $4\times10^6\Omega$.

In one embodiment, the resistance of the resistor 113 may be about 1/50 of that of the snake shaped poly 111.

The resistance of the snake shaped poly 111 is increased as a result of the spiral shape, so the high voltage would mainly drop across the snake shaped poly 111; and the drain voltage is sensed by leading out the second end or any other suitable point along the snake shaped poly 111.

Figure 4:
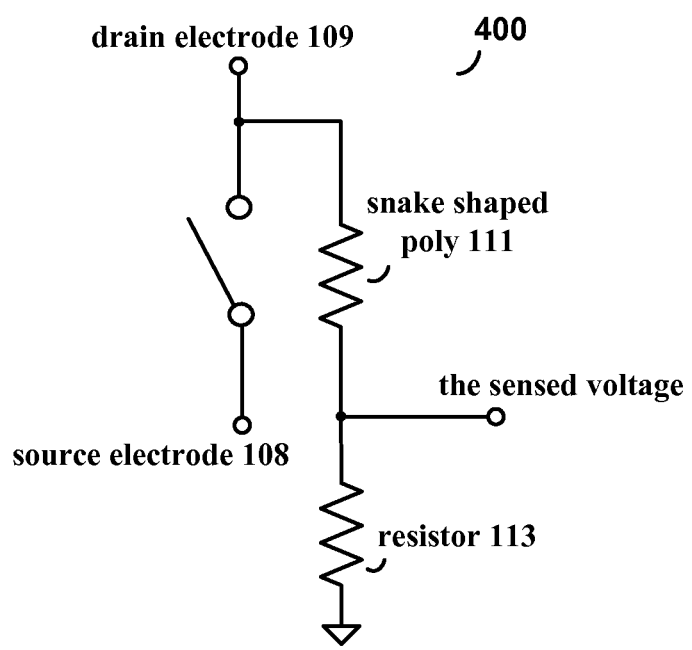
FIG. 4 schematically shows an equivalent circuit of the drain voltage sense.

Because the majority of the high voltage is dropped across the snake shaped poly 111 as discussed above, the resistor 113 would provide a low voltage (e.g., lower than 7V) sense signal indicative of the drain voltage which meets the voltage level requirement of control circuits. The sense signal would then be delivered to control circuits to execute UVLO, OVP or other control. The equivalent circuit of the drain voltage sense is shown in FIG. 4.

Figure 5:
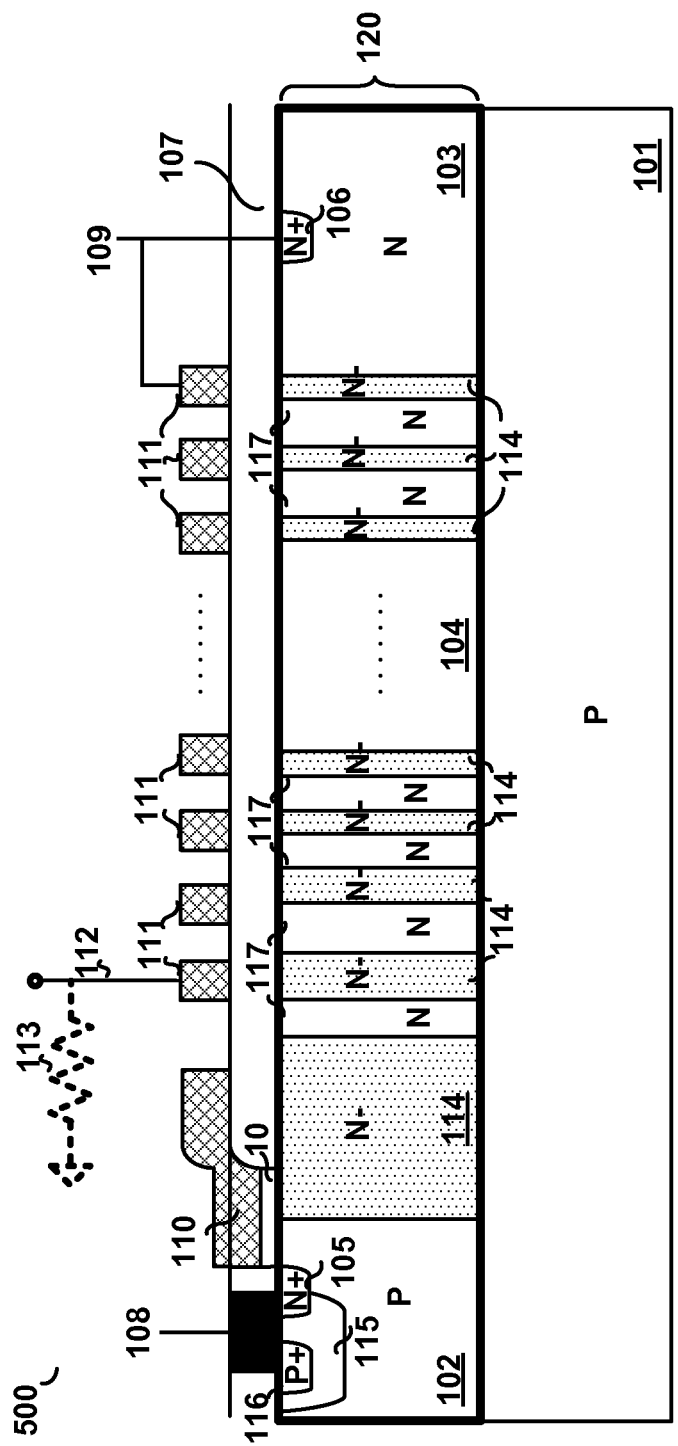
FIG. 5 schematically shows a cross-section view 500 of a high voltage switching device in accordance with an embodiment of the present invention.

FIG. 5 schematically shows a cross-section view 500 of a high voltage switching device in accordance with an embodiment of the present invention. The high voltage switching device in FIG. 5 is similar to that in FIG. 1. Different than the high voltage switching device in FIG. 1, the high voltage switching device in FIG. 5 further comprises a base region 115 of the first doping type formed in the source region 102.

The high voltage switching device in FIG. 5 comprises the snake shaped poly 111, which absorbs most of the high voltage drop. The sense signal indicative of the drain voltage would be obtained by coupling the second end or any other suitable point along the snake shaped poly 111. This sense signal is of low voltage level (e.g., lower than 7V) which meets the voltage level requirement of control circuits. So the sense signal would then be delivered to control circuits to execute UVLO, OVP, or other control.

FIG. 6A-6H partially schematically show cross-section views of a semiconductor substrate undergoing a process for forming a high voltage switching device in accordance with an embodiment of the present invention.

Figure 6A:
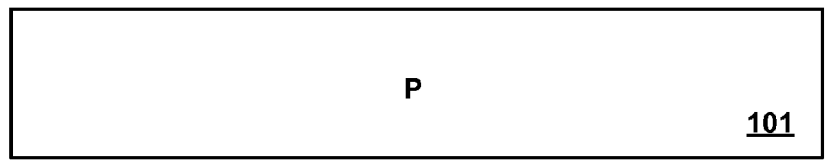
FIG. 6A-6H partially schematically show cross-section views of a semiconductor substrate undergoing a process for forming a high voltage switching device in accordance with an embodiment of the present invention.

As shown in FIG. 6A, the process includes forming a substrate 101 of a first doping type (e.g., P type). In one embodiment, the substrate is formed by diffusion technology.

Figure 6B:
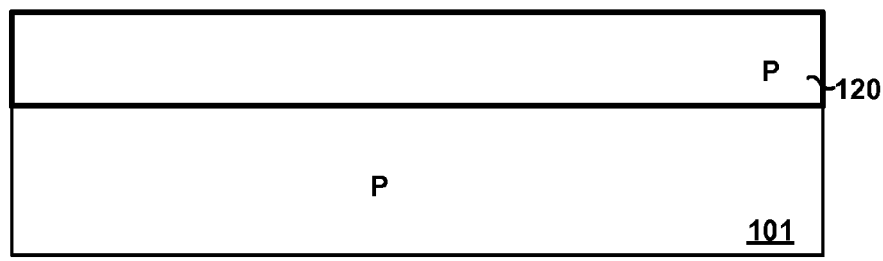

As shown in FIG. 6B, the process includes forming an epitaxial layer 120 of the first doping type (e.g., P type) on the substrate 101. In one embodiment, the epitaxial layer 120 may be formed by deposition technique such as CVD, PECVD, ALD, and/or other suitable deposition techniques.

Figure 6C:
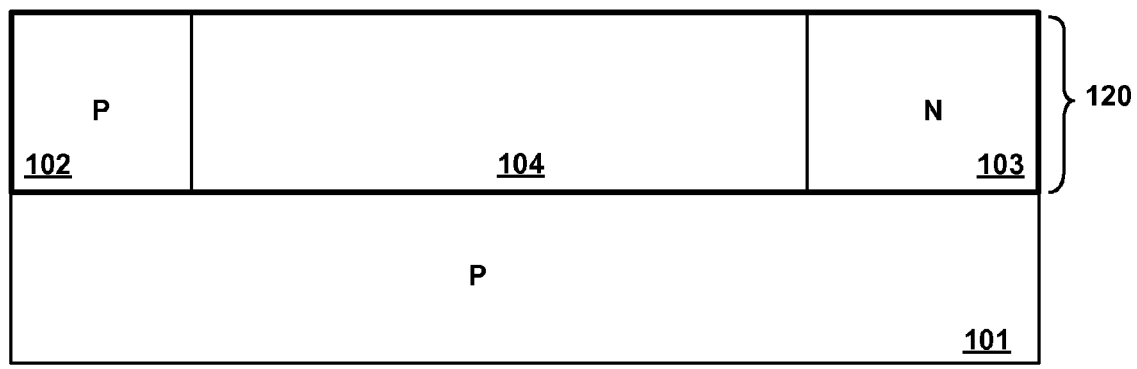

As shown in FIG. 6C, the process includes forming a source region 102, a drain region 103 and a drift region 104 in the epitaxial layer 120, wherein the drift region 104 is placed between the source region 102 and the drain region 103, and wherein the source region is of the first doping type (e.g., P type), and the drain region 103 is of a second doping type (e.g., N type). In one embodiment, the source region 102 and the drain region 103 may be formed by diffusion technique or implantation technique.

Figure 6D:
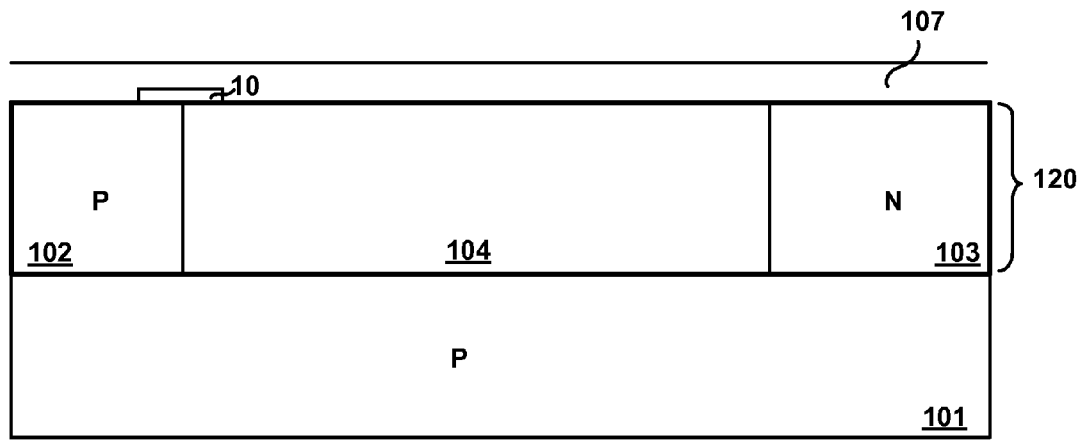

As shown in FIG. 6D, the process includes forming a gate oxide 10 and a field oxide 107 on the epitaxial layer 120, wherein part of the source region 102 is covered by the gate oxide 10, and the epitaxial layer other than the part covered by the gate oxide 10 is covered by the filed oxide 107. In one embodiment, the gate oxide 10 is formed by dry oxidation technique, and the field oxide 107 is formed by wet oxidation technique.

Figure 6E:
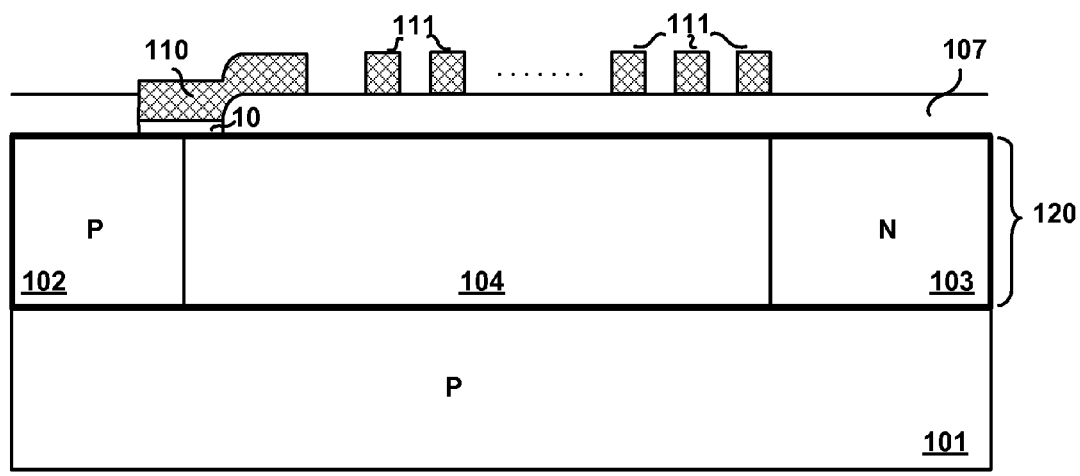

As shown in FIG. 6E, the process includes forming a gate 110 on the gate oxide, and forming a snake shaped poly 111 on the field oxide over the drift region 104, wherein the snake shaped poly 111 has a first end and a second end, and wherein the first end is contacted with the drain region 103, while the second end is close to the gate 110 but is separated from the gate 110. In one embodiment, the snake shaped poly 111 has a resistance falling to the range of $3 \times 10^6 \Omega \sim 5 \times 10^6 \Omega$. In one embodiment, the gate 110 comprises a poly gate. In one embodiment, the gate 10 and the snake shaped poly 111 are formed by deposition technique.

Figure 6F:
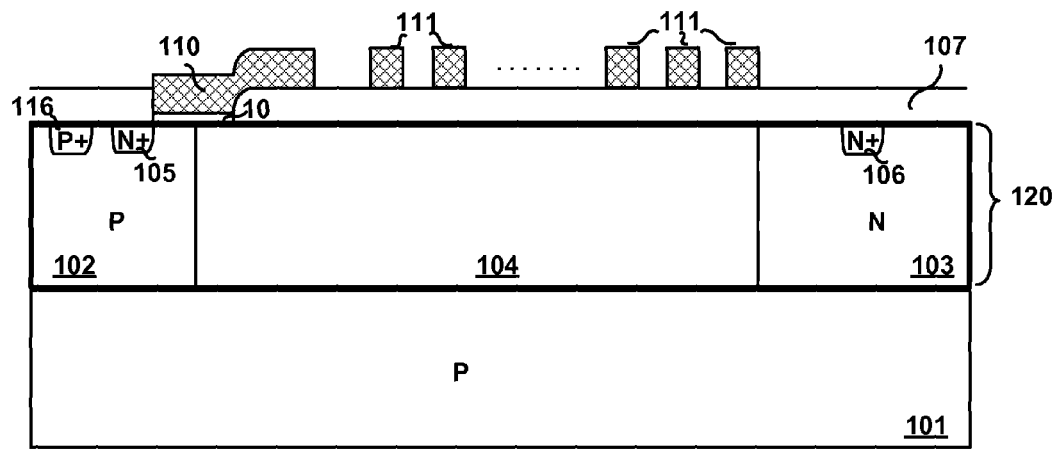

As shown in FIG. 6F, the process includes forming a first highly doped region 105 and a second highly doped region 116 in the source region 102, and forming a third highly doped region 106 in the drain region 103, wherein the first highly doped region 105 and the third highly doped region 106 are of the second doping type (e.g., N type), and the second highly doped region 116 is of the first doping type (e.g., P type). In one embodiment, the first highly doped region 105, the second highly doped region 116 and the third highly doped region 106 are formed by diffusion technique or implantation technique.

Figure 6G:
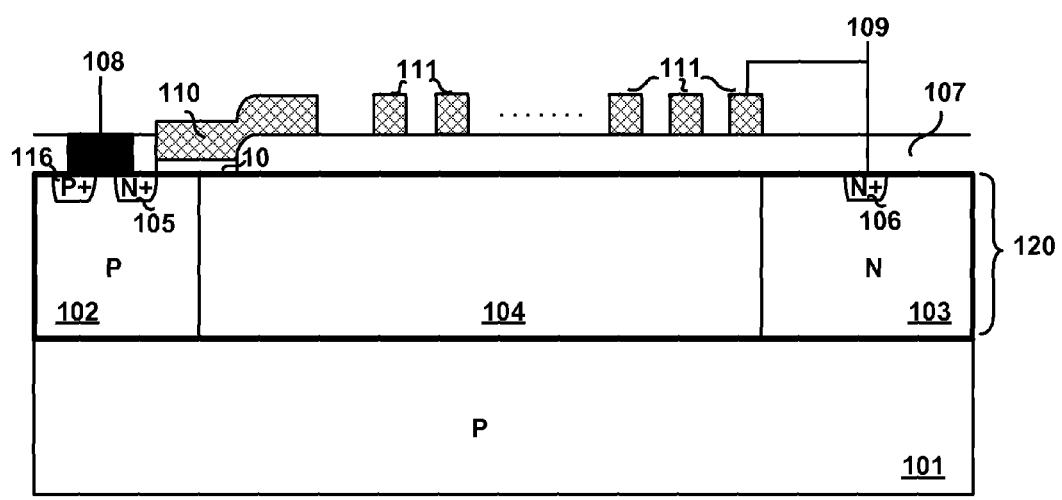

As shown in FIG. 6G, the process further includes forming a source electrode 108 and a drain electrode 109, wherein the source electrode 108 is contacted with the first highly doped region 105 and with the second highly doped region 116, while the drain electrode 109 is contacted with the third highly doped region 106.

Figure 6H:
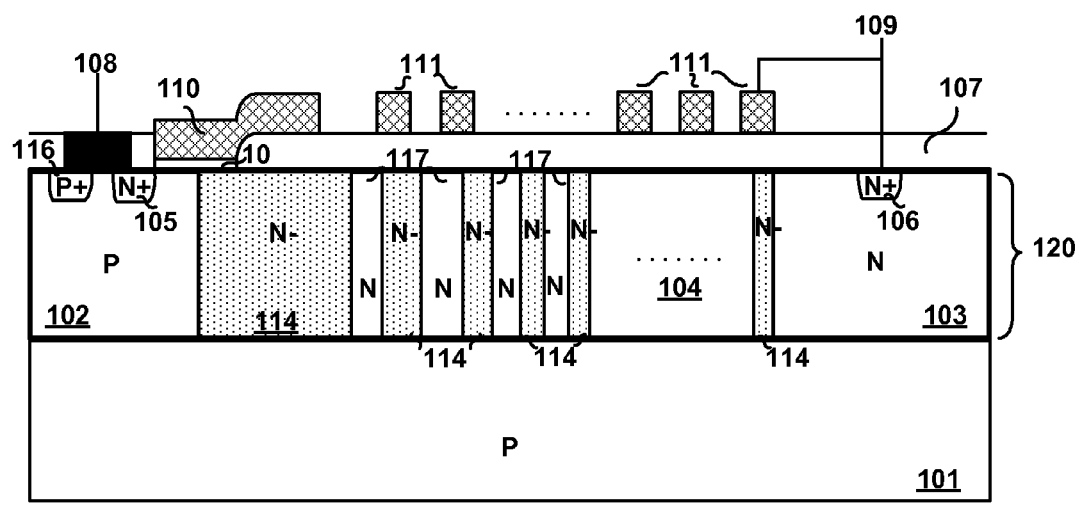

In one embodiment, in order to sustain much higher voltage, the process further includes forming several lightly doped regions 114 and several third regions 117 of normal doping level 117 in the drift region 104, wherein the lightly doped regions 114 and the third regions 117 are alternately in turn placed in the drift region 104, as shown in FIG. 6H. In one embodiment, the third regions 117 have a doping level similar to that of the drain region 103, the highly doped (N+) region (e.g., region 105, region 106 or region 116) has a doping level higher than that of the drain region 103, and the lightly doping regions 114 have a doping level lower than that of the drain region 103. In one embodiment, the lightly doped regions 114 and the third regions 117 are formed by diffusion technique or implantation technique.

Several embodiments of the foregoing high voltage switching device provide a sense signal indicative of the drain voltage with no extra pad and with high reliability compared to the conventional technique discussed above. Unlike the conventional technique, several embodiments of the foregoing high voltage switching device use snake shaped poly to increase the resistance, thus absorbing majority of the high voltage drop. In addition, several embodiments of the foregoing high voltage switching device need little improvement to the existing manufacture process, which further increases the reliability of the high voltage switching device.

An improved high voltage switching device and the manufacture process thereof have been disclosed. While specific embodiments of the present invention have been provided, it is to be understood that these embodiments are for illustration purposes and not limiting. Many additional embodiments will be apparent to persons of ordinary skill in the art reading this disclosure.

I claim:

1. A high voltage switching device, comprising:
    a substrate of a first doping type;
    an epitaxial layer formed on the substrate;
    a source region of the first doping type formed in the epitaxial layer;
    a drain region of a second doping type formed in the epitaxial layer;
    a drift region formed between the source region and the drain region;
    a gate oxide, part of the source region being covered by the gate oxide;
    a field oxide, wherein the epitaxial layer other than the part covered by the gate oxide is covered by the filed oxide;
    a gate formed on the gate oxide; and
    a snake shaped poly formed on the field oxide over the drift region, the snake shaped poly having a first end and a second end, the first end being contacted with the drain region, and the second end being close to the gate but being separated from the gate.

2. The high voltage switching device of claim 1, further comprising:
    a first highly doped region of the second doping type and a second highly doped region of the first doping type formed in the source region; and
    a third highly doped region of the second doping type formed in the drain region.

3. The high voltage switching device of claim 1, further comprising:
    a source electrode contacted with the first highly doped region and with the third highly doped region; and
    a drain electrode contacted with the second highly doped region.

4. The high voltage switching device of claim 1, wherein the high voltage switching device comprises an N type MOSFET, the first doping type is P type, and the second doping type is N type.

5. The high voltage switching device of claim 1, wherein the drift region comprises several lightly doped regions and several third regions of normal doping level, wherein the lightly doped regions and the third regions are alternately in turn placed in the drift region.

6. The high voltage switching device of claim 1, wherein the second end of the snake shaped poly is coupled to a ground reference via a resistor.

7. The high voltage switching device of claim 6, wherein a resistance of the resistor is about $\frac{1}{50}$ of that of the snake shaped poly.

8. The high voltage switching device of claim 1, wherein the snake shaped poly has a resistance in the range of $3 \times 10^6 \Omega \sim 5 \times 10^6 \Omega$.

9. The high voltage switching device of claim 1, further comprising a base region of the first doping type formed in the source region.

10. A method for forming a high voltage switching device, comprising:
    forming a substrate of a first doping type;
    forming an epitaxial layer of the first doping type on the substrate;
    forming a source region, a drain region and a drift region in the epitaxial layer, the drift region being placed between the source region and the drain region, the source region being of the first doping type, and the drain region being of a second doping type;
    forming a gate oxide and a field oxide on the epitaxial layer, part of the source region being covered by the gate oxide, and the epitaxial layer other than the part covered by the gate oxide being covered by the field oxide;
    forming a gate on the gate oxide, and forming a snake shaped poly on the field oxidation over the drift region, the snake shaped poly having a first end and a second end, the first end being contacted with the drain region, while the second end being close to the gate but being separated from the gate.

11. The method of claim 10, further comprising:

forming a first highly doped region and a second highly doped region in the source region; and forming a third highly doped region in the drain region, the first highly doped region and the third highly doped region being of the second doping type, and the second highly doped region being of the first doping type.

12. The method of claim 10, further comprising: forming a source electrode and a drain electrode, wherein the source electrode is contacted with the first highly doped region and with the second highly doped region, while the drain electrode 109 is contacted with the third highly doped region.

13. The method of claim 10, further comprising: forming several lightly doped regions and several third regions of normal doping level in the drift region, the lightly doped regions and the third regions being alternately in turn placed in the drift region.

14. The method of claim 10, wherein the snake shaped poly has a resistance in the range of $3\times10^6\Omega \sim 5\times10^6\Omega$.

* * * * *